United States Patent [19]

Modla

[11] 4,363,050
[45] Dec. 7, 1982

[54] DIGITIZED AUDIO RECORD AND PLAYBACK SYSTEM

[75] Inventor: Andrew A. Modla, Newtown, Pa.

[73] Assignee: RCA Corporation, New York, N.Y.

[21] Appl. No.: 172,756

[22] Filed: Jul. 28, 1980

[51] Int. Cl.³ ............................................. G11B 5/00
[52] U.S. Cl. .................................................. 360/32
[58] Field of Search ....................................... 360/32;
340/347 A–347 D

[56] References Cited

U.S. PATENT DOCUMENTS

| | | | |
|---|---|---|---|
| 3,174,141 | 3/1965 | Sullivan et al. | 360/32 |
| 3,296,371 | 1/1967 | Fox | 179/1 |
| 3,398,241 | 8/1968 | Lee | 179/1 |
| 3,564,142 | 2/1971 | Rothauser et al. | 179/1 |
| 3,577,084 | 5/1971 | Archerson et al. | 328/14 |
| 3,908,085 | 9/1975 | Gagnon | 179/1 |
| 4,069,970 | 1/1978 | Bozzara et al. | 235/153 |
| 4,125,898 | 11/1978 | Deltarr et al. | 364/718 |
| 4,179,584 | 12/1979 | Tanimoro et al. | 179/1 |
| 4,271,438 | 6/1981 | Cornell | 360/32 |

FOREIGN PATENT DOCUMENTS 2022370  12/1979  United Kingdom ................. 360/44

*Primary Examiner*—Vincent P. Canney
*Attorney, Agent, or Firm*—Samuel Cohen; Joseph S. Tripoli; Donald W. Phillion

[57] ABSTRACT

A system for digitally processing an analog signal, such as an audio signal, for recording and playback. The system comprises means responsive to the analog signal to produce sequences of binary 1's for those portions thereof whose amplitude exceeds a given signal level and to produce sequences of binary 0's for those portions thereof whose amplitude is less than said given signal level, and encoding means responsive to each sequence in the order of their occurrence to form a digital word representing the number of bits in each sequence. Also provided are memory means for storing said digital words in said order of occurrence, and means responsive to the stored digital words, in said order of occurrence, to produce a two level signal whose first level represents said sequences of binary 1's and whose second level represents said sequences of binary 0's. Filtering means can be provided to filter the two level signal to produce an apporoximate reproduction of the original analog signal.

9 Claims, 6 Drawing Figures

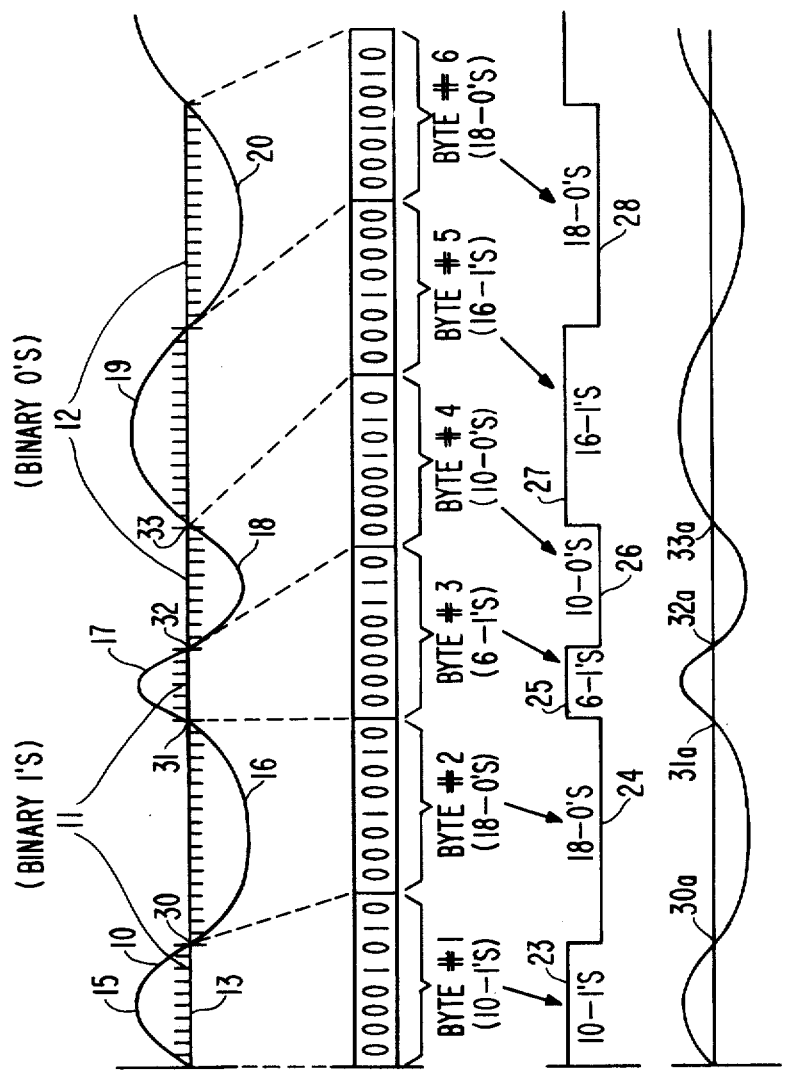

DIGITIZED AUDIO RECORD AND PLAYBACK SYSTEM

This invention relates generally to digitized speech recording and playback systems and more particularly to an improved digitized recording and playback system particularly adapted to microcomputers.

It is well known in the art to record audio signals by digitizing an audio signal into sequences of binary 1's and 0's with the binary 1's representing samplings of the audio signal above a given threshold voltage and binary 0's representing samplings of the audio signal below said given threshold signal. The sampling rate should conform to Nyquist's Theorem in that it should be at least twice the highest frequency desired to be retained in the received audio signal.

The sequences of binary 1's and 0's are stored in a RAM memory, one bit to a memory cell. When reproduction or playback is desired the memory can be accessed and the sequences of bits converted into a two level signal with the upper level segments representing sequences of binary 1's and the lower level sequences of binary 0's.

Such two level signal can then be supplied through appropriate filter means which outputs a signal similar to the received audio signal. However such signal is quite intelligible and satisfactory for many applications, such as home computer games and toys, for example.

Many of the sequences of consecutive binary 1's and 0's can be quite long since the sampling rate must be twice the highest frequency to be preserved. Thus, the amount of memory required to store the total sequences of bits can be quite large in the prior art system wherein one storage cell is required for each bit.

The present invention provides a system wherein the amount of memory required to store the sequences of binary 1's and 0's representing an audio signal is considerably less than required by the prior art system described above.

In accordance with a preferred form of the invention there is provided a means responsive to an analog signal to produce sequences of binary 1's for those portions of the analog signal whose amplitude is greater than a given signal level and to produce sequences of binary 0's for those portions thereof whose amplitude is less than said given signal level. Also provided are means responsive to each sequence, in the order of their occurrence, to form an N bit digital word representing the number of bits in said each sequence, and second means for storing said digital words. Further provided are means responsive to said stored digitized words, in said order of occurrence, to produce a two level signal whose first level represents said sequences of binary 1's and whose second level represents said sequences of binary 0's.

In the drawings:

FIG. 1 shows a typical received audio signal signal and the digitizing thereof into alternate sequences of binary 1's and 0's;

FIG. 2 shows the sequences of binary 1's and 0's of FIG. 1 converted into binary values representing the number of binary 1's and 0's in each contiguous sequence and stored as 8 bit bytes in a RAM memory;

FIG. 3 shows a two level signal resulting from converting the alternate sequences of binary 1's and 0's stored in memory as binary values into a two level signal;

FIG. 4 shows a two level waveform of FIG. 3 after filtering;

Figure 5:
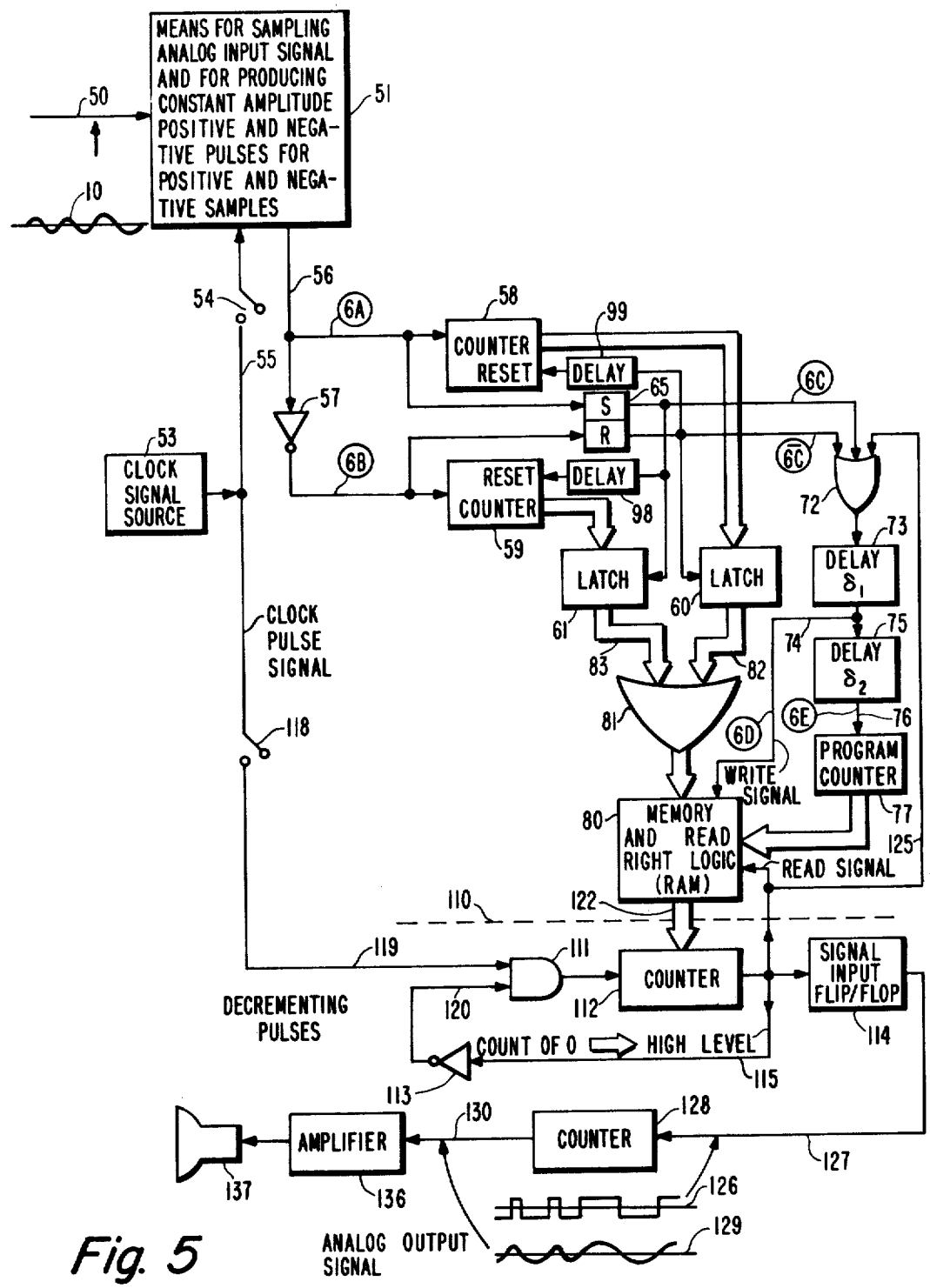
FIG. 5 is a logic diagram showing one implementation of the invention.

In describing the invention FIGS. 1-4 will be discussed first to describe the processing of the signal to first encode such signal, then record it, and finally to play it back as an audio signal. Subequently the logic of FIG. 5 will be described as a preferred implementation of the invention.

In FIG. 1 a received audio signal 10 is digitized into binary 1's and 0's represented by the positive and negative going vertical lines 10 and 11, respectively, for example. The binary 1's represent the positive portion of the signal with respect to a threshold voltage 13 and the binary 0's represent the portions of the signal which are negative with respect to the threshold voltage 13. The frequency of the sampling pulses which produce the binary 1's and 0's 11 and 12 must be at least twice the rate of the highest frequency component of the audio signal desired to be preserved, in accordance with Nyquist's Theorem.

Accordingly it can be seen that the rate of sampling pulses for the lowest frequency of the received signal is much greater than such lowest frequency component. As an example, assume the highest frequency component to be preserved is 2,000 Hz and the lowest frequency component is 40 Hz. The frequency of the sampling rate must therefore be at least 4,000 Hz which is 100 times the frequency of the lowest audio frequency component. Thus, for a half cycle of the lowest frequency component there will be 50 binary 1's or 0's. In the prior art such a sequence of 50 binary 1's or 0's would require 50 memory cells in memory. In the present invention such 50 binary 1's and 0's can be represented by an 8 bit binary word. Because of the difficulty in showing so many samplings in FIG. 1 the ratio of sampling to the lowest frequency component has been reduced. Thus in FIG. 1 there are 10 samplings for the first positive segment 15 of the audio signal 10. Such 10 samplings (binary 1's) are stored in RAM 80 of FIG. 5 (to be described later) as an 8 bit binary word having the value 13.

During the subsequent negative excursion 16 (FIG. 1) of audio signal 10 of FIG. 1, 18 samplings are taken, resulting in 18 binary 0's being stored as the 8 bit binary value of byte #2 in RAM 80, as shown in FIG. 2. The next occurring positive excursion 17 of FIG. 1 requires 6 samplings resulting in 6 binary 1's being stored as the binary value of byte #3 (FIG. 2) of RAM 80 of FIG. 5.

The next 3 segments of the audio signal, designated by reference characters 18, 19 and 20, and which are respectively negative, positive, and negative excursions of the audio signal 10 of FIG. 1 about the reference or threshold voltage 13 are stored as binary values representing the sequences of binary 0's, 1's and 0's, as shown in bytes #4, #5 and #6 (FIG. 2), in RAM 80 of FIG. 5.

It will be noted that successive bytes stored in RAM 80 will alternately define segments of 1's and 0's.

To reproduce, i.e. playback, the audio signal representing binary words stored in RAM 80 are successively read from RAM 80 and then decoded to determine how many binary 1's and 0's they represent. For example, byte #1 (FIG. 2) is read and decoded back into a sequence of 10 binary 1's. These 10 binary 1's are supplied to a first counter means which, in cooperation with a flip-flop circuit for example, produces a high level signal segment 23 of FIG. 3 having a length equal to the 10 binary 1's. The next byte #2 (FIG. 2) is then read from RAM 80 (FIG. 5) and found to represent 18 binary 0's. Such 18 binary 0's are converted to a sequence of 18 0's and supplied to a second counter means which, in cooperation with said flip-flop circuit, will produce a low level signal segment 24 (FIG. 3) having a time duration equal to the 18 binary 0's.

In a similar manner the 6 binary 1's of segment 25 (FIG. 3), the 10 binary 0's of segment 26, the 16 binary 1's of segment 27 and the 18 binary 0's of segment 28 will produce successive high and low level signals which collectively form a two level signal whose transition points coincide closely with the 0 crossover points of the received audio signal 10 with respect to the threshold voltage level 13 of FIG. 1.

Filtering of the two level signal of FIG. 3 results in the signal shown in FIG. 4 whose similarity with the received audio signal of FIG. 1 is evident. The 0 crossover points, such as points 30a, 31a, 32a and 33a of the waveform of FIG. 4 correspond closely to the 0 crossover points 30, 31, 32 and 33 of the waveform of FIG. 1, although not exactly, due to the discrete nature of the digitizing process. When supplied to appropriate speaker means the waveform of FIG. 4 will reproduce the received audio waveform of FIG. 1 with quite adequate fidelity for normal speech.

Referring now to FIG. 5 there is shown logic implementing the foregoing structure and method for processing an audio signal. In FIG. 5 the received audio signal 10 is supplied via input lead 50 to digitizer logic 51 which becomes energized to digitize the input signal only when switch 54 is closed to supply the clock pulses from clock signal source 53 to digitizer 51. The switch 54 can be contained in a microphone, for example. The digitized audio signal, consisting of sequences of positive and negative pulses (also referred to herein as binary 1's and 0's although they are in fact individual pulses), is supplied from digitizer 51 via lead 56 directly to the input of counter 58 and through INVERTER 57 to counter 59.

Thus it can be seen that only binary 1's are supplied to counter 58 and only binary 0's are supplied to counter 59. The outputs of each of the counters 58 and 59 are supplied respectively to the latches 60 and 61 at the end of each sequence count due to the action of flip-flop 65. More specifically, assume counter 58 has been counting a sequence of binary 1's. At the end of this sequence of binary 1's a sequence of binary 0's will necessarily occur. The first binary 0 will reset the previously set flip-flop 65, thereby energizing latch 60 and supplying the total number of binary 1's recorded in counter 58 to said latch 60. Further, resetting of flip-flop 65 will reset counter 58 to 0 through delay means 99 in preparation for the next sequence of binary 1's. Next, after counter 59 has counted the said subsequent sequence of binary 0's, a second sequence of binary 1's will follow. The first binary 1 of said second sequence will set flip-flop 65 and thereby energize latch 61 to store the contents of counter 59 in said latch 61. Further, setting of flip-flop 65 will reset counter 59 to 0 through delay means 98 in preparation for the next sequence of binary 0's. Thus it can be seen that latches 60 and 61 alternately receive the contents of counters 58 and 59 to thereby store alternately occurring sequences of binary 1's and 0's.

Figure 6:
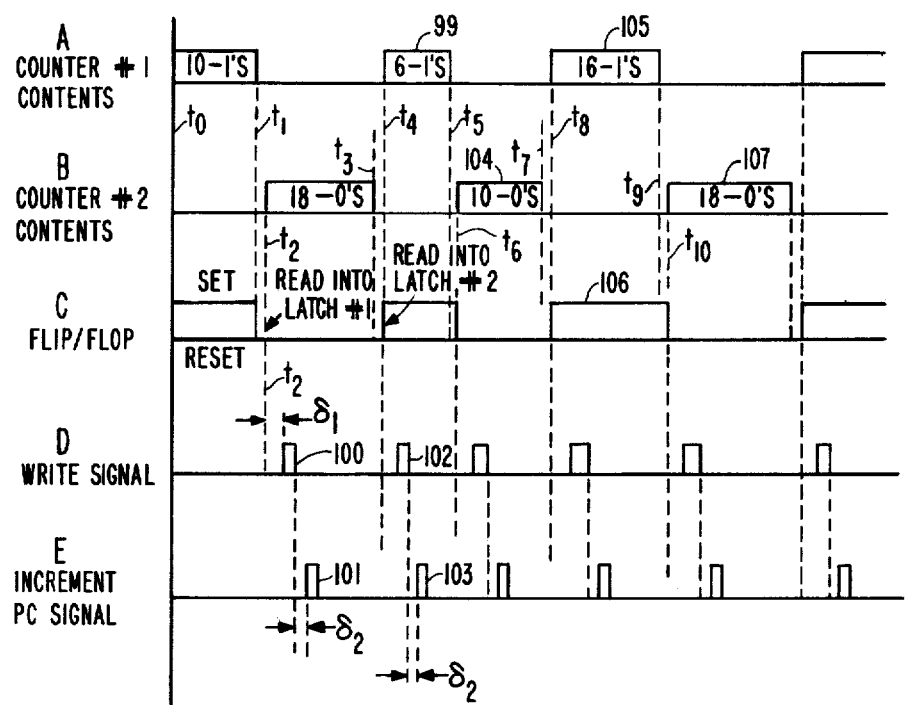
FIG. 6 is a set of waveforms showing the timing relationship between signals at various points in the diagram of FIG. 5.

The foregoing can perhaps be seen more readily from the waveforms of FIG. 6. For brevity the waveforms of FIG. 6 will be referred to as waveforms 6A, 6B, ... 6E rather than waveform A or B of FIG. 6.

The waveforms 6A and 6B represent the alternate storing of alternate sequences of binary 1's and 0's in counters 58 and 59. For purposes of continuity of discussion the same pattern of sequences of binary 1's and 0's are shown in waveforms 6A and 6B as are shown in FIGS. 1-3. Thus, at time $t_0$ in waveform 6A the sequence of 10 binary 1's begins to enter counter 58 (FIG. 5). At time $t_1$ such sequence of 10 binary 1's has been completely counted by counter 58. A short time later, at time $t_2$, the first binary 0 of the sequence of binary 0's caused by negative excursion 16 of the input signal 10 of FIG. 1 occurs. At this time flip-flop 65 of FIG. 5 is reset to energize latch 60 to enter the count of 10 contained in counter 58 into said latch 60. The leading edge of the signal caused by resetting flip-flop 65 is also passed as a pulse through OR gate 72, $\delta_1$ delay means 73, and then through "write" signal lead 74 to memory and read/write logic 80. The count of 10 contained in latch 60 is then supplied through summing OR gate 81 to the memory word address of memory 80 pointed to by the memory address contained in program counter 77.

A short time later, equal to the $\delta_2$ delay of delay means 75, the program counter 77 is incremented by 1 to point to the next memory location in preparation for the storing of the number of binary 0's contained in latch 61.

For purposes of clarity the waveforms of FIG. 6 are indicated in the logic of FIG. 5 at those points where they occur by means of encircled legends such as 6A, 6B ... 6E. Thus the encircled legend 6E points to the output lead 76 from delay means 75 indicating that the signal represented by waveform 6E appears at that point in the logic of FIG. 5.

It is also to be noted that due to the delay means 73 the write pulses of waveforms 6D do not occur until after the switching (setting or resetting) of flip-flop 65, thereby ensuring that the write signal does not occur until the contents of counters 58 and 59 have been transferred therefrom into latches 60 and 61.

Further the incrementing of the program counter 77 cannot occur until after the occurrence of the write signal of waveform 6D. This is accomplished by the $\delta_2$ delay means 75 which prevents the program counting incrementing signals of waveform 6E from occurring until after the write signals of waveform 6D have occurred.

Returning again to waveforms 6A and 6B it can be seen that the sequence of 18 contiguous binary 0's beginning at time $t_2$ terminates at time $t_3$. Shortly thereafter, at time $t_4$, the first binary 1 of the sequence 99 of 6 binary 1's resulting from the positive excursion 17 of input signal 10 of FIG. 1 occurs. At this time $t_4$ flip-flop 65 is set, thereby enabling latch 61 to store therein the contents of counter 59. At time $t_4$ the contents of counter 59 is a binary 18 representing the 18 binary 0's counted as a result of the negative excursion 16 of the input signal 10 of FIG. 1. Subsequent to the setting of flip-flop 65 at time $t_4$ the write signal 102 of waveform 6D occurs followed $\delta_2$ time later by the program counter incrementing signal 103 of waveform 6E. At time $t_5$ the counting of the sequence of 6 binary 1's (segment 99 of waveform 6A) is completed by counter 58 and at time $t_6$ the 6 binary 1's are clocked into latch 60 when flip-flop 65 is reset by the first binary 0 in sequence 104 of waveform 6B. In a similar manner the sequence of 10 binary 0's in segment 104 of waveform 6B, the 16 binary 1's of segment 105 of waveform 6A and the 18 binary 0's of segment 107 of waveform 6B are entered, respectively, into their associated latches 61 and 60 of FIG. 5, followed by the write signals of waveform 6D and the PC incrementing signals of waveform 6E.

By the foregoing procedure the entire received audio signal is digitally recorded in memory 80 of FIG. 5. The opening of switch 54 disconnects the clock source 53 from sampling logic 51 to disable counters 58 and 59 and latches 61 and 60 and to reset program counter 77 to zero.

To playback the audio signal stored in memory 80 the logic below dotted line 110 of FIG. 5 and the clock source 53 is employed. The playback logic is energized by closing switch 118 thereby supplying the clock pulses from clock source 53 to one input terminal 119 of AND gate 111. Such clock pulses will pass through AND gate 111 if AND gate 111 has been primed by the binary 1 supplied to the other input 120 thereof from the output of counter 112 through INVERTER 113. More specifically, if counter 112 is at any count other than 0 it will prime AND gate 111 to allow the decrementing clock pulses from clock source 53 to pass through AND gate 111 to decrement counter 112 until it reaches the count of 0. The count of 0 output from counter 112 will perform the following functions. Firstly, it will block clock pulses from passing through AND gate 111 because of the inverting function of the INVERTER 113. Secondly, it will cause the contents of the next memory location in memory read/write logic 80 pointed to by program counter 77 to be supplied to counter 112 via bus 122. Thirdly, it will supply an incrementing signal via lead 125 through OR gate 72, delay means 73, delay means 75, and then to the program counter 77 where it will increment said program counter 77 to point to the next memory word location in memory 80 in preparation for the next sequence of binary 1's or 0's to be supplied from memory 80 to counter 112.

The output of counter 112 is also supplied to the input of single input flip-flop 114 which responds to the count of 0 of counter 112 to change from whatever state (level) it is in to the other state (level), thereby producing the two level signal 126 on its output terminal 127. Such output signal which corresponds to the two level signal of FIG. 3, is filtered by filter 128 to produce the filtered signal 129 on lead 130. It will be noted that output signal 129 is very similar to the analog input signal 10 (FIG. 1) except that the amplitudes of the positive and negative excursions are fairly constant in output signal 129 whereas they vary in the original analog input signal 10. The 0 crossover points of output signal 129 and the input signal 10 correlate very closely, the small differences therein being due to the discrete nature of the digitizing pulses of analog input signal 10. The output of the filter 128 can be supplied through amplifier 136 to suitable speaker means 137.

I claim:

1. A system for processing an analog signal comprising:
    means responsive to said analog signal to produce sequences of binary 1's for those portions thereof whose amplitude is greater than a given signal level and to produce sequences of binary 0's for those portions thereof whose amplitude is less than said given signal level;
    first means responsive to each sequence, in the order of their occurrence, to form an N bit digital word of a fixed length and representing the number of bits in said each sequence;
    second means for sequentially storing said digital words as they occur to form a series of co-existent sequentially stored digital words;
    third means responsive to said sequentially stored digital words, in said order of occurrence, to produce a two level signal whose first level represents said sequences of binary 1's and whose second level represents said sequences of binary 0's.

2. A system for processing an analog signal comprising:
    means for digitizing the continuous portions of said analog signal greater than a given signal level into uniformly spaced pulses of a first polarity and the continuous portions less than said given signal level into uniformly spaced pulses of a second polarity;
    means responsive to the pulses representing each continuous portion of said analog signal to form an N bit digital word of a fixed length and having a binary value equal to the number of pulses representing said each continuous portion;
    memory means for storing said digital words in the order of occurrence of the continuous portions represented thereby to form a series of co-existent sequentially stored digital words;
    means for reading said digital words from said memory means in said order of occurrence; and
    means responsive to said read-out digital words in said order of occurrence to produce a two level signal whose first and second levels correspond, respectively, to the portions of said digitized analog signal represented by said uniformly spaced pulses of said first and second polarity.

3. A signal processing system comprising:
    means for digitizing those portions of said received signal exceeding a first given signal level into sequences of binary 1's and the remaining portions into sequences of binary 0's;
    means responsive to each sequence, in the order of their occurrence, to form a series of digital words each of the same fixed length and having a value representing the number of bits in said each sequence;
    memory means for storing said digital words to form a series of co-existent sequentially stored digital words; and
    means for reading from said memory means and for decoding said digital words, in said order of occurrence, to produce a signal in which the portions thereof derived from said digital words representing binary 1's exceed a second given signal level and in which the remaining portions thereof are less than said second given signal level.

4. A system for processing a signal comprising:
    means responsive to said signal to produce sequences of binary 1's for those portions thereof whose amplitude exceeds a given signal level, and to produce sequences of binary 0's for the remaining portions;
    means responsive to each sequence to form a digital word of a fixed length and representing the number of bits in said each sequence; and
    means for storing said digital words in a known order to form a series of co-existent sequentially stored digital words.

5. A method for processing a signal comprising the steps of:
- digitizing said signal to produce sequences of binary 1's for those portions thereof whose amplitude exceeds a given signal level and sequences of binary 0's for the remaining portions;
- generating, for each sequence, a digital word of a fixed length and representing the number of bits in said each sequence; and
- storing said digital words in a known order to form a series of co-existent sequentially stored digital words.

6. A method for processing an analog signal comprising the steps of:
- digitizing said analog signal to produce sequences of pulses of a first polarity for those portions thereof whose amplitude is greater than a given signal level and to produce sequences of pulses of the second polarity for those portions thereof whose amplitude is less than said given signal level;
- generating for each sequence, in their order of occurrence, a digital word of a fixed length and representing a number of pulses in said each sequence;
- storing said digital words to form a series of co-existent sequentially stored digital words; and
- reading out said digital words in their sequentially stored order;
- producing in response to said read-out digital words an analog signal whose amplitude exceeds a predetermined signal level during time periods corresponding to said sequences of pulses of said first polarity and whose amplitude is less than said predetermined signal level during time periods corresponding to said sequences of pulses of said second polarity.

7. A method for processing an analog signal comprising the steps of:
- digitizing the portions of said analog signal greater than a given signal level into binary 1's and the portions less than said given signal into binary 0's;
- generating, in response to each portion of said analog signal a digital word of a fixed length and having a binary value equal to the number of bits in said each portion;
- storing said digital words into a memory in the order of occurrence of the portions represented thereby to form a series of co-existent sequentially stored digital words;
- reading said digital words from said memory in said order of occurrence; and
- decoding said read-out digital words in said order of occurrence to produce a two level signal whose first and second levels correspond, respectively, to the portions of said digitized analog signal comprising binary 1's and binary 0's.

8. A digitized audio playback system comprising:
- memory means having a plurality of word storage locations containing a plurality of digital words of equal binary length stored concurrently and sequentially therein in parallel manner and representing numerical count values equal to the number of binary 1's and binary 0's in alternate strings of binary 1's and binary 0's in a stream of bits; and
- means for reading and decoding said concurrent and sequentially stored equal length digital words, in said order of sequential parallel storing, to produce a signal in which the portions thereof derived from said digital words representing binary 1's exceed a given signal level and in which the remaining portions thereof are less than said given signal level.

9. A method for processing a series of digital words each of the same length, concurrently and sequentially stored in parallel manner in a memory, and successively having numerical count values equal to the number of binary 1's and binary 0's in alternate strings of binary 1's and binary 0's in a stream of bits and comprising the steps of:
- reading out in parallel manner from said memory said equal length concurrent and sequentially stored digital words in their sequentially stored order; and
- producing in response to said read-out digital words in their sequentially read-out order an analog signal whose amplitude exceeds a predetermined signal level during time periods corresponding to said strings of binary 1's and whose amplitude is less than said predetermined signal level during time periods corresponding to said strings of binary 0's.

* * * * *